(12) United States Patent
Miyano

(10) Patent No.: US 11,348,633 B2
(45) Date of Patent: May 31, 2022

(54) SELECTIVELY CONTROLLING CLOCK TRANSMISSION TO A DATA (DQ) SYSTEM

(71) Applicant: Micron Technology, Inc., Boise, ID (US)

(72) Inventor: Kazutaka Miyano, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/139,310

(22) Filed: Dec. 31, 2020

(65) Prior Publication Data

US 2021/0125658 A1    Apr. 29, 2021

Related U.S. Application Data

(63) Continuation of application No. 16/169,593, filed on Oct. 24, 2018, now Pat. No. 10,892,002.

(51) Int. Cl.
*G11C 7/22* (2006.01)
*G11C 11/4076* (2006.01)
*H03L 7/081* (2006.01)

(52) U.S. Cl.
CPC .......... *G11C 11/4076* (2013.01); *G11C 7/222* (2013.01); *H03L 7/0814* (2013.01)

(58) Field of Classification Search
CPC ........................................................ G11C 7/22
USPC .................................................. 365/189.011
See application file for complete search history.

(56) References Cited

U.S. PATENT DOCUMENTS

| | | |
|---|---|---|
| 8,379,459 B2 | 2/2013 | Gower et al. |
| 9,088,268 B2 * | 7/2015 | Mazumder ............. H03H 11/40 |
| 10,403,340 B2 | 9/2019 | Komatsu et al. |
| 2005/0128828 A1 | 6/2005 | Lee |
| 2008/0080263 A1 | 4/2008 | Kim |
| 2009/0006881 A1 | 1/2009 | Ogura |
| 2010/0214864 A1 | 8/2010 | Smith et al. |
| 2010/0220536 A1 | 9/2010 | Coteus et al. |
| 2011/0057697 A1 | 3/2011 | Miyano |
| 2012/0134223 A1 | 5/2012 | Miyano |
| 2014/0119141 A1 | 5/2014 | Tamlyn et al. |
| 2015/0048870 A1 | 2/2015 | Ku |
| 2015/0214962 A1 | 7/2015 | Miyano |
| 2015/0340073 A1 | 11/2015 | Seo et al. |
| 2017/0154673 A1 | 6/2017 | Seo et al. |

FOREIGN PATENT DOCUMENTS

| | | |
|---|---|---|
| TW | I314740 B | 9/2009 |
| WO | 2016/0167911 A1 | 10/2016 |

OTHER PUBLICATIONS

Office Action for that ROC (Taiwan) Patent Application No. 108124683 dated Mar. 16, 2021, 9 pages.

* cited by examiner

*Primary Examiner* — Jason Lappas

(74) *Attorney, Agent, or Firm* — Fletcher Yoder, P.C.

(57) ABSTRACT

An apparatus may include a delay line that receives a command signal and provides a delayed command signal. The apparatus may include an edge starter that provides a clock enable signal responsive, at least in part, to a change in level of the command signal. A gate circuit of the apparatus may provide a shift clock signal responsive, at least in part, to the clock enable signal. The apparatus may also include a shifter that captures and shifts the delay command signal responsive, at least in part, to the shift clock signal.

20 Claims, 7 Drawing Sheets

SELECTIVELY CONTROLLING CLOCK TRANSMISSION TO A DATA (DQ) SYSTEM

CROSS-REFERENCE TO RELATED APPLICATION

This application is a continuation of U.S. Non-Provisional application Ser. No. 16/169,593, entitled "SELECTIVELY CONTROLLING CLOCK TRANSMISSION TO A DATA (DQ) SYSTEM," filed Oct. 24, 2018, which is hereby incorporated by reference in its entirety for all purposes.

BACKGROUND

Embodiments described herein generally relate to the field of memory devices. More specifically, the current embodiments include one or more systems, devices, and methods for command synchronization in memory devices.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

In semiconductor memory, proper operation of the memory device is based on the correct timing of various internal command and clock signals. For example, in reading data from the memory device, internal clock signals that clock data path circuitry to provide (e.g. output) read data should be provided substantially simultaneously with internal read command signals to output the read data without error. If the timing of the internal read command signals and the timing of the internal clock signals are not compatible or inaccurate, the read command may be inadvertently ignored and/or the read data provided by the memory may not be correct (e.g., include at least some data associated with another read command). Likewise, in writing data to the memory device, internal clock signals that clock data path circuitry to write data should be provided with timing relationships compatible with internal write command signals to enable the data path circuitry to provide the write data for writing to the memory device. Inaccurate timing of the internal command and clock signals may cause the write command to be inadvertently ignored and/or for incorrect write data to be provided to the memory device (e.g., include at least some data associated with another write command).

Moreover, a "latency" may be selected (e.g., programmed, desired, used, given, etc.) to set a time, typically in numbers of clock periods, between receipt of a read command by the memory device and when the data is output by the memory device. A "write latency" may also be selected to set a time, also typically in numbers of clock periods, between receipt of a write command by the memory device and when the write data is provided to the memory device. The latencies may be selected, for example, to accommodate clock signals of different frequencies (i.e., different clock periods).

As may be appreciated, the higher the frequency of the clock signals in memory devices, the more challenging it may be to generate correctly timed (e.g., synchronous) internal clock and command signals. For example, the frequency of memory clock signals may be 1 GHz or higher. Further complicating the matter is that multi-data rate memories may provide and receive data at a rate higher than the memory clock signal, which may represent the rate at which commands may be executed. As a result, command signals and an internal clock signal may need to be synchronized in order to maintain proper timing. An example of a multi-data rate memory is one that outputs read data at a rate twice that of the clock frequency, such as outputting data synchronized with rising and falling clock edges of the memory clock signal.

Thus, to facilitate command synchronization in synchronous memory devices, certain circuits may be provided at inputs of the memory device, outputs of the memory device and internal to the memory device. As appreciated, additional circuitry may utilize additional power. In designing components of memory devices to aid in command and clock synchronization, power consumption provides an additional factor that may be considered and reduced whenever possible, without reducing the efficacy of the memory device and synchronization of command signals in the memory device.

BRIEF DESCRIPTION OF THE DRAWINGS

Various aspects of this disclosure may be better understood upon reading the following detailed description and upon reference to the drawings in which.

DETAILED DESCRIPTION

Figure 1:
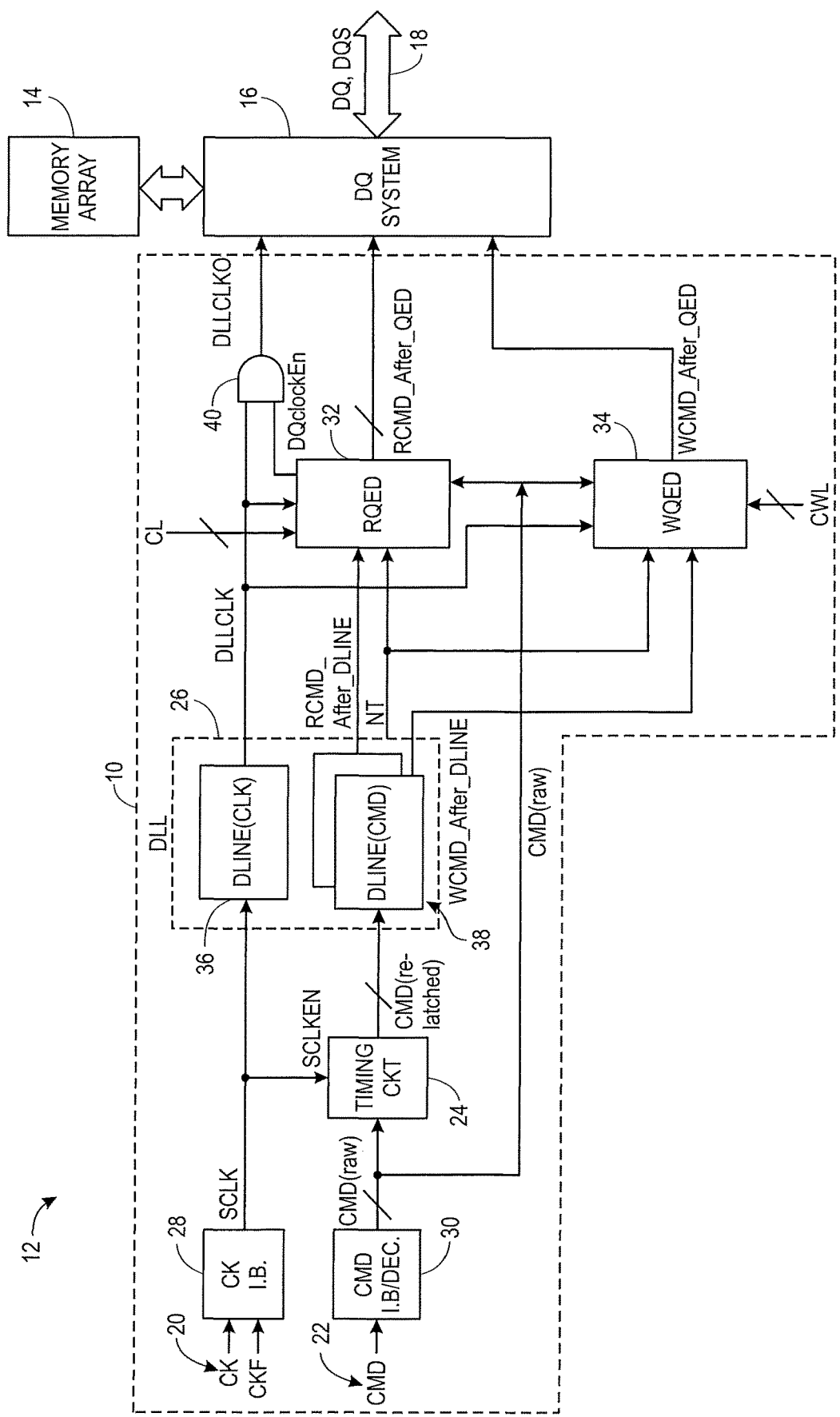
FIG. 1 is a block diagram of a memory apparatus, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions are made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

As is described above, memory devices may use circuitry and techniques to synchronize various internal signals with an internal clock to facilitate functionality of the memory device through various modes of operation. For instance, in synchronous dynamic random access memory (SDRAM), such as double data rate type four SDRAM (DDR4 SDRAM) or double data rate type five SDRAM (DDR5 SDRAM), the synchronization of command signals, such as read and write command signals, with an internal clock signal is desirable to facilitate proper operation of the memory device. More specifically, and as described in detail below, a delay locked loop clock signal (DLLCLK) may be provided to a data (DQ) system for performing memory read operations. As appreciated, additional circuitry may utilize additional power. In designing components of memory devices to aid in command and clock synchronization, power consumption provides an additional factor that may be considered and reduced whenever possible, without reducing the efficacy of the memory device and synchronization of command signals in the memory device.

Techniques described herein may include descriptions of systems and/or methods for selectively providing a delay locked loop clock signal to a DQ system to reduce power consumed by the DQ system when not actively performing, or actively preparing to perform, a read operation. For example, a logic gate (e.g., an AND gate or other suitable logic gate) may be included to permit a clock signal to transmit to the DQ system in response to a clock enable signal. In some embodiments, the clock enable signal is generated based in part on delay indications and latency indications, and in response to an incoming read command that is to be used to access memory. In this way, these techniques described may permit automatic synchronism of enabling and/or disabling the clock enable signal with incoming read commands, such that circuitry permits the clock enable signal to automatically assert one or more clock cycles before the DQ system receives an incoming command while automatically de-asserting the clock enable signal one or more clock cycles after the incoming command completes transmission to the DQ system. The assertion/de-assertion of the clock enable signal may be facilitated by one or more subsets of flip-flops and one or more logic gates that respond to an incoming memory command.

Keeping this in mind, FIG. 1 is a block diagram of a control system 10 of a memory apparatus 12. As used herein, an "apparatus" can refer to, for example, circuitry, a semiconductor die, a device, or a system. The apparatus 12 includes a memory array 14 of memory cells, which may be, for example, dynamic random access memory (DRAM) cells, static random access memory (SRAM) cells, flash memory cells, or some other types of memory cells. The apparatus 12 may receive memory commands and provide (e.g., generate) corresponding control signals within the apparatus 12 to execute various memory operations. For example, the apparatus 12 may receive various memory addresses. The apparatus 12 may operate to access the memory array 14 based at least in part on clocking signals (e.g., delay locked loop clock signal, DLLCLKO) and command signals (e.g., read command, RCMD and/or write command, WCMD). Output data from the memory array 14, or input data to be stored in the memory array 14, may be transmitted to and/or from a data (DQ) system 16 via data channel 18 and may correspond to various memory operations.

The control block 10 includes a clock path 20 and a command path 22. The clock path 20 receives true and complementary clock signals CK and CKF and propagates the received clock signals through various circuitry and ultimately to the DQ system 16 as the delay locked loop clock signal (DLLCLKO), as described in detail below. The delay locked loop clock signal (DLLCLKO) may be based at least in part on the received clock signals. In the present embodiment, the control block 10 includes timing circuitry 24 and delay locked loop circuitry 26 among the clock path 20 and the command path 22. The clock path 20 includes clock input buffer circuitry 28 (e.g., input circuitry) that receives the clock signals (CK and CKF) and provides a system clock signal (SCLK). The system clock signal (SCLK) may be provided to the DLL circuitry 26 and to the timing circuitry 24 (e.g., as system clock enable signal, SCLKEN).

The command path 22 may provide the command signals (e.g., read command, RCMD and/or write command, WCMD) to the DQ system 16. The control block 10 may respond to one or more received memory command signals (CMD) to perform various operations on the memory array 14. For example, the control block 10 may be used to provide internal control signals to read data from and write data to the memory array 14. Components of the command path 22 receive latency signals, such as a column address strobe (CAS) latency signal (CL) and a CAS write latency signal (CWL), and a delay indication signal (NT), as elaborated below. The command path 22 also receives various clock signals from the clock path 20.

A command input buffer and decoder circuitry (CMD I.B/Dec.) 30 may receive the memory command signals (CMD) that convey a memory access command, such as a read command, a write command, an on-die termination (ODT) command indicative of an instruction to cause a read operation, a write operation, an on-die termination operation, or the like. The command input buffer and decoder circuitry 30 may decode the memory command signals (CMD) and provide one or more raw memory command signals (CMD (raw)) to the timing circuitry 24, to read data enable delay (RQED) circuitry 32, and to write data enable delay (WQED) circuitry 34. The raw memory command signals (CMD (raw)) may include an internal command signal, a read/write selection signal indicative of a read or write operation responsive to the memory command signals (CMD) indication of the read or write operation, or the like.

The timing circuitry 24 may provide one or more latched command signals (CMD (re-latched)) to the DLL circuitry 26 in response to the raw memory command signals (CMD (raw)). The timing circuitry 24 may control timing of the latched command signals (CMD (re-latched)) relative to the raw memory command signals (CMD (raw)) such that the latched command signals (CMD (re-latched)) are synchronized with the system clock enable signals (SCLKEN). As should be appreciated, although not depicted, the command input buffer and decoder circuitry 30 may provide an internal ODT command signal to the timing circuitry 24 in response to the memory command signals (CMD) and those skilled in the art appreciate the operations associated with ODT commands.

The DLL circuitry 26 may include a clock delay line 36 and a command delay line 38. The DLL circuitry 26 may be active during read and write operations, and may operate to adjust a delay of the clock delay line 36 and/or of the command delay line 38. The delay of the clock delay line 36 and/or of the command delay line 38 may change in response to activation of the system clock signal (SCLK) (e.g., not change when the system clock signal, SCLK, is inactive). The clock delay line 36 may provide the delay locked loop clock signal (DLLCLK) to logic gate 40 (e.g., AND gate), to read data enable delay (RQED) circuitry 32, and to write data enable delay (WQED) circuitry 34. The command delay line 38 may provide the read data enable delay (RQED) circuitry 32 and/or the write data enable delay (WQED) circuitry 34 with the latched command signals (CMD (re-latched)) based at least in part on the type of command received (e.g., read, write). The read data enable delay (RQED) circuitry 32 may receive a read command from the command delay line 38, referred to herein as "RCMD_After_DLINE signal." The write data enable delay (WQED) circuitry 34 may receive a write command from the command delay line 38, referred to herein as "WCMD_After_DLINE signal." In this way, the read data enable delay (RQED) circuitry 32 may be provided with the RCMD_After_DLANE signal and not the WCMD_After_DLINE signal, which is instead provided to the write data enable delay (WQED) circuitry 34.

The read data enable delay (RQED) circuitry 32 and/or the write data enable delay (WQED) circuitry 34 may also receive the CAS latency signal (CL), the CAS write latency signal (CWL), and the delay indication signal (NT). The read data enable delay (RQED) circuitry 32 may operate to shift or delay the read command in synchronism with the delay locked loop clock (DLLCLK) signal by an amount determined based at least in part on the CAS latency signal (CL) and the delay indication signal (NT) to provide a delayed read command (RCMD_After_QED) to the DQ system 16. Similarly, the write data enable delay (WQED) circuitry 34 may operate to shift or delay the write command in synchronism with the delay locked loop clock (DLLCLK) signal by an amount determined based at least in part on the CAS write latency signal (CWL) and the delay indication signal (NT) to provide a delayed write command (WCMD_After_QED) to the DQ system 16. The CAS latency signal (CL), the CAS write latency signal (CWL), and the delay indication signal (NT) may be adjusted in response to a variety of conditions, including operating conditions such as process, voltage, and/or temperature variations within a particular portion of the apparatus 12 and/or of the control system 10.

The latency signals (e.g., CL and/or CWL) may be defined by a number of clock cycles, for example, of a global clocking signal (e.g., external clock signal, CK). The delay indication signal (NT) value may be a number of clock cycles equivalent to a delay between receipt of the system clock signal (SCLK) and the delay locked loop clock signal (DLLCLK). The CAS latency signal (CL) value is column address strobe (CAS) latency that may account for a delay time between when the control system 10 receives the read command and when an output buffer in the DQ system 16 receives read data responsive to the read command based on a clock signal (e.g., the delay locked loop clock signal, DLLCLK) including time for data to be accessed and provided to an output bus (e.g., via a DQ pad in the DQ system 16). The CAS write latency signal (CWL) value may account for a delay time between when the control system 10 receives the write command and when the DQ system 16 receives write data responsive to the write command based on DQS signals including time for data to be accessed and provided to an input bus (e.g., via a DQ pad before the DQ system 16). The CAS latency signal (CL) value and the CAS write latency signal (CWL) value may be represented as numbers of clock cycles of the global clocking signal. For example, the CAS latency signal (CL) value and the CAS write latency signal (CWL) value may be frequency dependent values. In this way, the values of the NT/CL/CWL signals are determined by the number of clock cycles of the external clock signal (CK) and thus, the system clock (SCLK), and are dependent on the clock cycle of the external clock signal (CK). For this reason, higher frequency (or lower clock cycle) of the external clock (CK) may cause the read or write data associated with the DQ system 16 not to be synchronized with the delay locked loop clock signal (DLLCLK) within the time corresponding to the values of the NT/CL/CWL.

In accordance with embodiments described herein, based on the values of the NT/CL/CWL signals, the start timings of providing the delay locked loop clock signal (DLLCLK) to the DQ system 16 are controllable to permit making the delay locked loop clock signal (DLLCLK) transmit to the DQ system (e.g., as DLLCLKO) in response to a read command, thereby decreasing power consumed by the DQ system 16 when not operating to perform a read command. To elaborate, the clock path 20 also includes the logic gate 40 coupled to the DLL circuitry 26 and to the read data enable delay (RQED) circuitry 32. The logic gate 40 provides the delay locked loop clock signal (DLLCLKO) to the DQ system 16, responsive to the delay locked loop clock signal (DLLCLK) transmitted from the DLL circuitry 26 and responsive to a DQ clock enable signal (DQclockEn) transmitted from read data enable delay (RQED) circuitry 32.

In this way, the delay locked loop clock signal (DLLCLKO) is transmitted to the DQ system 16 when the DQ system 16 is to use such a clock to access the memory array 14 or communicate with the data channel 18. For example, the delay locked loop clock signal (DLLCLKO) may be permitted to transmit in response to receiving the delayed read command signal (RCMD_After_QED) but not in response to receiving the delayed write command signal (WCMD_After_QED). Selectively transmitting the delay locked loop clock signal (DLLCLK) as the delay locked loop clock signal (DLLCLKO) may reduce an overall power consumed by the apparatus 12 because power consumption by components that usually receive the delay locked loop clock signal (DLLCLKO) (even when the clocking signal is not used for a memory operation) may consume a reduced amount power (e.g., zero) when not in use to perform a memory read operation. It may be desired to permit the delay locked loop clock signal (DLLCLKO) to transmit to the DQ system 16 a particular duration (e.g., number of clock cycles or transitions) before the DQ system 16 receives the delayed read command signal (RCMD_After_QED) and remain enabled for an additional duration (e.g., number of clock cycles or transitions) after the delayed read command signal (RCMD_After_QED) completes transmission. These varied enabled/disabled durations may be managed through a state (e.g., low level signal, high level signal) of the DQ clock enable signal (DQclockEn). It is noted that specifics regarding the state changes of the DQ clock enable signal (DQclockEn) are discussed in more detail below with regard to how the state changes affect the provision of the delay locked loop clock signal (DLLCLKO) to the DQ system 16.

Figure 2:
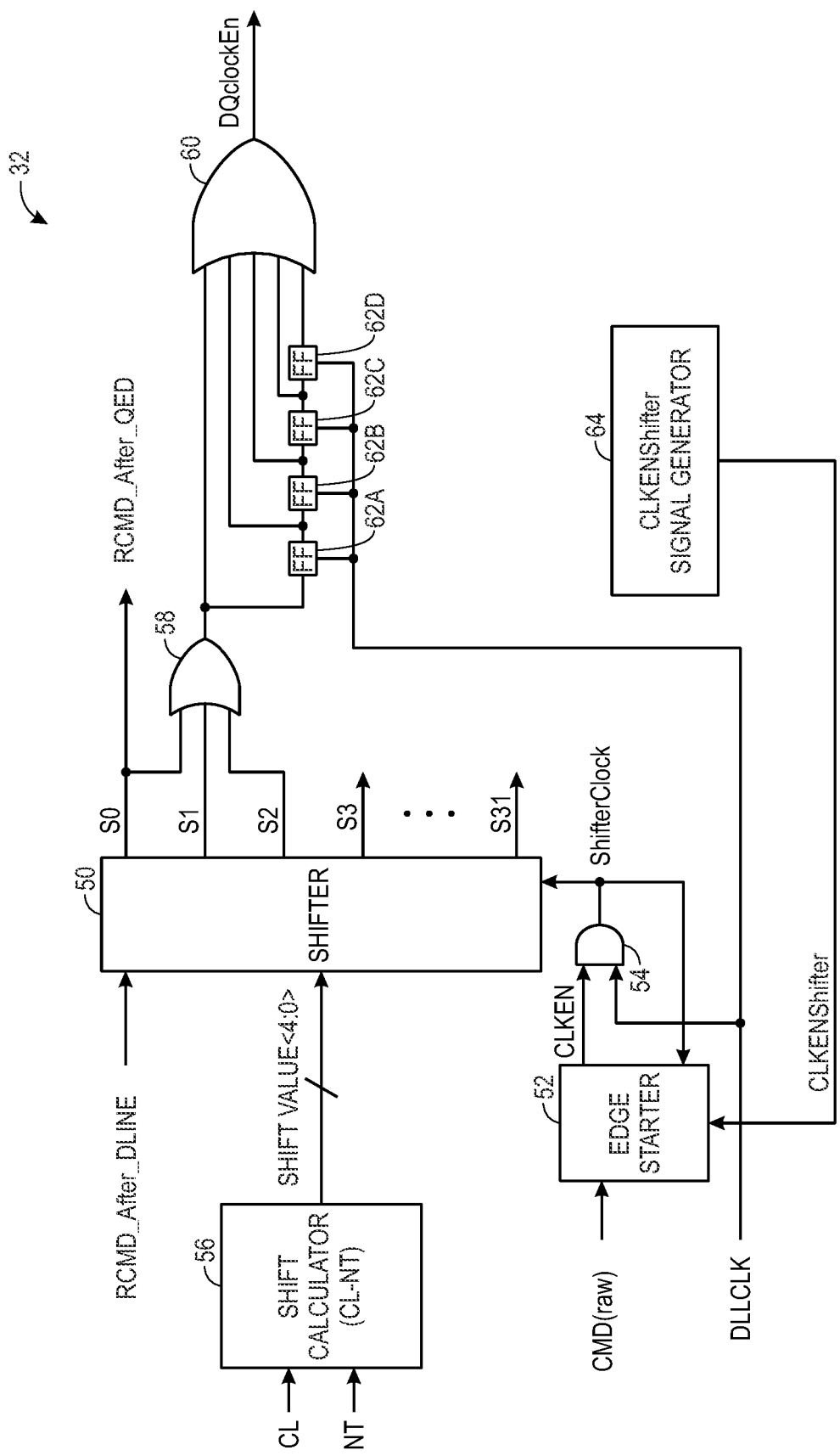
FIG. 2 is a block diagram of read data enable delay (RQED) circuitry of the memory apparatus of FIG. 1, in accordance with an embodiment.

With the forgoing in mind, FIG. 2 is a block diagram of the read data enable delay (RQED) circuitry 32 of FIG. 1. As shown, the control block 10 may receive a read command signal, thus the read data enable delay (RQED) circuitry 32 may receive a RCMD_After_DLINE signal from the command delay line 38 at a shifter 50 in addition to the raw command (CMD (raw)) from the command input buffer and decoder circuitry 30 at an edge starter 52. In response to receiving the raw command (CMD (raw)), the edge starter 52 generates a clock enable signal (CLKEN) used to selectively provision the delay locked loop clock (DLLCLK) to the shifter 50 as a shifter clock signal (ShifterClock). The shifter clock signal (ShifterClock) is generated in response to a matching state (e.g. both enabled) of the clock enable signal (CLKEN) from the edge starter 52 and the delay locked loop clock signal (DLLCLK). The particular matching state is dependent on a particular logic gate, for example, as depicted a logic gate 54 (e.g., AND gate) is used to determine when the shifter clock signal (ShifterClock) is transmitted to the shifter 50 and thus defines the matching state. It should be understood that the logic gate 54 and any of the other described logic gates in this disclosure, may be substituted for one or more other suitable logic gates, such as an OR gate, an inverting gate, a NAND gate, a NOR gate, or the like, which may be arranged to provide a desired output.

Figure 3:
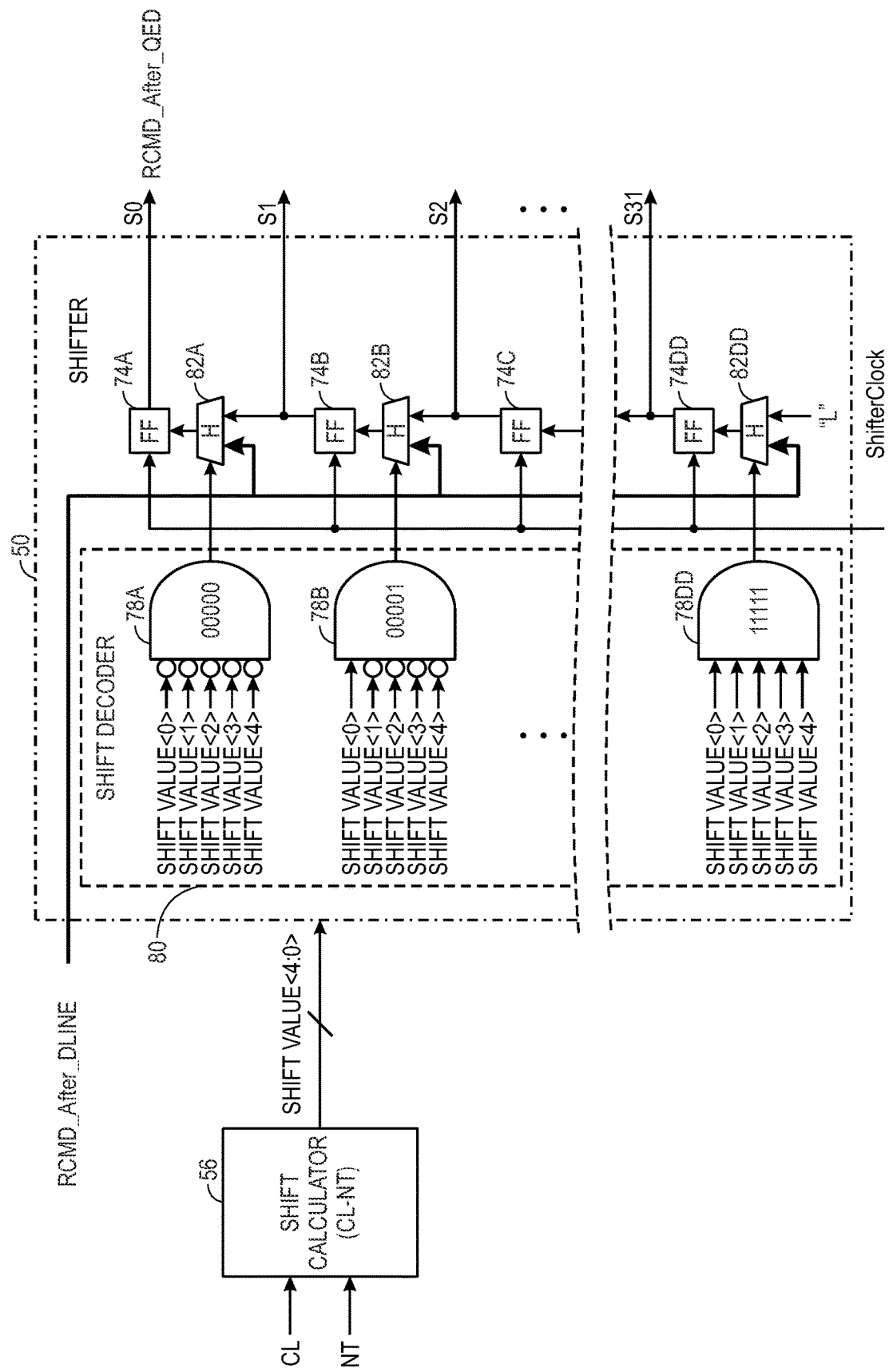
FIG. 3 is a block diagram of an example shifter of the RQED circuitry of FIG. 2, in accordance with an embodiment of this disclosure.

To elaborate on the operation of the shifter 50, the edge starter 52, and a shift calculator 56 of FIG. 2, FIG. 3 is a block diagram of an example of the shifter 50 of FIG. 2. It is noted that FIG. 2 will be explained in further detail below with respect to logic gate 58, logic gate 60, flip-flops 62, and signal generator 64 after introducing the shifter 50 circuitry. As depicted, the shifter 50 receives a shifter clock signal (ShifterClock) from the edge starter 52 and the RCMD_After_DLINE signal from the command delay line 38. The shifter 50 also receives a shift value (Shift value<4:0>) from the shift calculator 56 in response to a calculation result determined by the shift calculator 56. It should be understood that using the difference between the CAS latency signal (CL) value and the delay indication signal (NT) value (e.g., CL-NT) is one example of a suitable calculation to perform to base the shift value (Shift value<4:0>) on. As depicted, the RCMD_After_DLINE signal is thus captured and shifted one-stage at a time through shift-stages represented by flip-flops 74 (e.g., 74A, 74B, 74C . . . 74DD) each time the shifter clock signal (ShifterClock) is a high level signal. The RCMD_After_DLINE signal may transmit through the shifter 50 beginning at a flip-flop of the flip-flops 74 based on a starting flip-flop selected by the shift value signal (Shift_value<4:0>) being transmitted to multiple logic gates 78 (e.g., 78A, 78B, 78C . . . 78DD). For example, if the shift value signal (Shift_value<4:0>) equals 2, the flip-flop 74C is generally selected to transmit the RCMD_After_DLINE signal first.

The starting flip-flop is selected using the binary representation of the shift value signal (Shift_value<4:0>) that is transmitted from the shift calculator 56 to a shift decoder 80. The shift value signal (Shift_value<4:0>) may be generated at least in part based on a calculation result associated with the shift calculator 56, such as a difference between the CAS latency signal (CL) value and the delay indication signal (NT) value (e.g., CL-NT). For example, the shift value signal (Shift value<4:0>) may equal the binary representation of any number between zero (e.g., 00000) and thirty-one (e.g., 11111), such as four (e.g., 00100) or ten (e.g., 01010). It should be understood that any suitable range of shift values may be used based on the number and/or combination of the logic gates 78 used by the shifter 50. Each bit of the shift value signal (Shift_value<4:0>) may transmit simultaneously to the shift-decoder 76 via individual communicative couplings coupled to each of the logic gates 78 such that each low level signal or high level signal may be received at a same time by each of the logic gates 78.

The shift decoder 80 may be internal to the shifter 50 and may output one or more signals indicative of logical results from the logic gates 78 to one or more multiplexers 82 (e.g., 82A, 82B . . . 82DD). For example, the shift decoder 80 may include the logic gates 78 that each receive a same shift value signal (Shift_value<4:0>) input and generate an output based on the particular combination of states of the shift value signal (Shift_value<4:0>). The respective outputs from the logic gates 78 may be used to operate the multiplexers 82. As depicted, a selected logic gate (e.g., for example, logic gate 78A when the shift value signal equals "00000") corresponds to the particular gate of the logic gates 78 that inverts a suitable number of bits of the shift value signal (Shift_value<4:0>) to drive a high level output to its corresponding multiplexer (e.g., in this example, multiplexer 82A) of the multiplexers 82. When the selected one of the logic gates 78 operates the corresponding one of the multiplexers 82 to select the high level signal input (e.g., "H"), the RCMD_After_DLINE signal transmits first through the corresponding one of the multiplexers 82 to the selected one of the flip-flops 74. From there, the RCMD_After_DLINE signal is transmitted from the selected one of the flip-flops 74 through subsequent flip-flops 74 until reaching the first flip-flop 74A corresponding to a zero, or starting, binary count (e.g., 00000).

Returning to FIG. 2, at each point of the transmission of the RCMD_After_DLINE signal (e.g., read command delayed by a particular amount by the delay locked line circuitry 26) through the shift-stages (e.g., flip-flops 74) of the shifter 50, the value from each of the flip-flops 74 is output through various terminals (e.g., S0, S1, S2 . . . S31). The first output (S0) of the shifter 50 may be used to transmit the delayed read command signal (RCMD_After_QED) to the DQ system 16. The first three outputs (S0, S1, S2) couple to a logic gate 58 (e.g., OR gate) that outputs to an additional logic gate 60 (e.g., OR gate).

The logic gate 58 and/or the logic gate 60 may cause the DQ clock enable signal (DQclockEn) to take an active high level signal (e.g., enabled) when the delayed read command (RCMD_After_QED) is transmitted at a third output (S2). In other words, the DQ clock enable signal (DQclockEn) may take the active high level at a timing that is two clock cycles earlier than when the delayed read command (RCMD_After_QED) is transmitted via the first output (S0). The logic gate 58 and/or the logic gate 60 may co-operate with one or more flip-flops 62 (e.g., 62A, 62B, 62C, 62D) to cause the DQ clock enable signal (DQclockEn) to continue to hold the active high level for four clock cycles after the delayed read command (RCMD_After_QED) has completed transmission from the first output (S0) (e.g., such that each of the inputs into the logic gate 58 are at a low level). As depicted, the one or more flip-flops 62 are coupled in series. Therefore, when the logic gate 58 transmits a low level signal in response to receiving three low levels, the low level signal is clocked through each of the one or more flip-flops 62 for four clock cycles (e.g., corresponding to a number of flip-flops). It should be understood that the number of flip-flops 62 is programmable such that more or less than four flip-flops may be used to adjust a number of clock cycles in between a falling edge (e.g., the transmission end) of the delayed read command (RCMD_After_QED) and a falling edge (e.g., the transmission end) of the DQ clock enable signal (DQclockEN).

Accordingly, the delay locked loop clock signal (DLLCLK) may be provided to the DQ system 16 (e.g., as DLLCLKO) only when the DQ system 16 is to use such a clock signal to perform a memory read operation, as discussed above. It is noted that although not depicted, the circuitry shown in FIG. 2 with respect to the read data enable delay (RQED) circuitry 32 may be generally used for the write data enable delay (WQED) circuitry 34. Differences may include that the write data enable delay (WQED) circuitry 34 does not include the logic gate 58, the logic gate 60, nor the flip-flops 62 coupled in series. The write data enable delay (WQED) circuitry 34 may also receive the CAS write latency signal (CWL) instead of the CAS latency signal (CL).

Continuing on to describe additional circuitry shown in FIG. 2, the shifter clock signal (ShifterClock) is determined based at least in part on the clock enable signal (CLKEN). The clock enable signal (CLKEN) is generated by the edge starter 52 in response to the raw command signals (CMD (raw)) and a clock enable shifter signal (CLKENShifter) transmitted to the edge starter 52 from a signal generator 64. The shifter clock signal (ShifterClock) may be derived based at least in part on the delay lock loop clock signal (DLLCLK) and based on the clock enable signal (CLKEN) via the logic gate 54.

Figure 4:
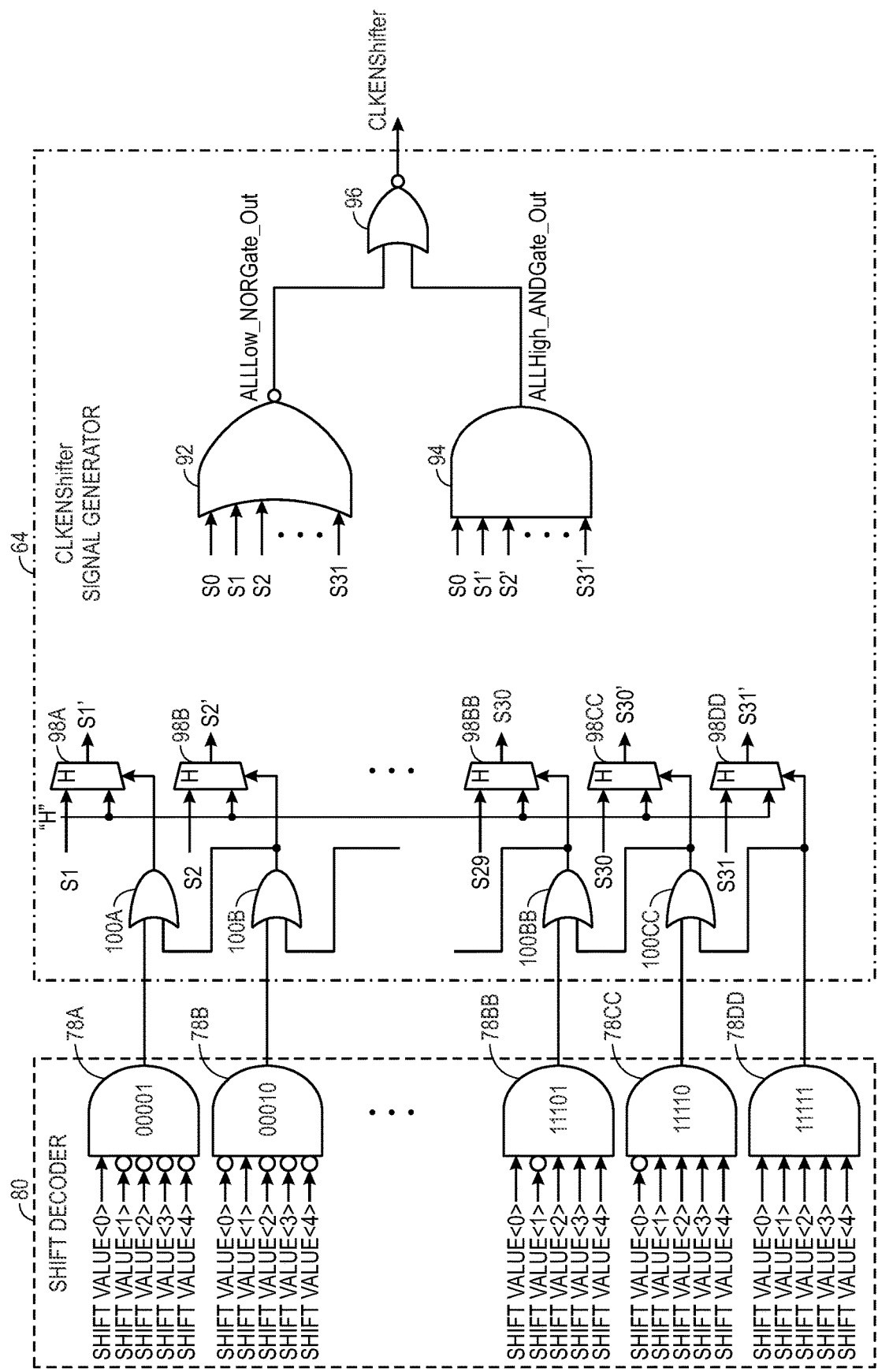
FIG. 4 is a block diagram of an example signal generator of the RQED circuitry of FIG. 2, in accordance with an embodiment of this disclosure.

To elaborate, FIG. 4 is a block diagram of the signal generator 64 of FIG. 2. The signal generator 64 may communicatively couple to the outputs of the shifter 50 (e.g., S1, S2 . . . S31) to receive signals from the shifter 50. The signal generator 64 may include a logic gate 92 (e.g., NOR gate) and logic gate 94 (e.g., AND gate). The logic gate 92 may receive each of the outputs (e.g., S1, S2 . . . S31) from the shifter 50 and may output a high level signal (e.g., ALLLow_NORGate_Out=logical high, 1) in response to the outputs from the shifter 50 (e.g., S1, S2 . . . S31) each having a low level signal. The logic gate 92 may output a low level signal (e.g., ALLLow_NORGate_Out=logical low, 0) if one or more inputs into the logic gate 92 (e.g., one or more outputs from the shift decoder 80) are a high level signal.

Similarly, the logic gate 94 may receive a first output (S0) from the shifter 50 and one or more modified outputs (e.g., S1', S2' . . . S31') based on the outputs from the shift decoder 80. The logic gate 94 may output a high level signal (e.g., ALLHigh_ANDGate_Out=logical high, 1) in response to each of the received signals having a high level signal. The logic gate 94 may output a low level signal (e.g., ALLHigh_ANDGate_Out=logical low, 0) in response to any of the respective modified outputs (e.g., S1', S2' . . . S31') and/or the first output (S0) from the shift decoder 80 having a low level signal. Since the clock enable shifter signal (CLKENShifter) outputs based on a logic result of a logic gate 96 (e.g., NOR gate), the clock enable shifter signal (CLKENShifter) may have a high level when an output signal (ALLLow_NORGate_Out) from the logic gate 92 and an output signal (ALLHigh_ANDGate_Out) from the logic gate 94 are both low signals. That is, when one or more of the outputs from the shifter 50 (e.g., S0, S1 . . . S31) is at a high level and any one of the modified outputs (e.g., S1', S2' . . . S31') or the first output (S0) from the shift decoder 80 is at a low level.

As further depicted in FIG. 4, the modified outputs (e.g., S1', S2' . . . S31') are derived respectively from a second output (S1) of the shifter 50 to a last output (S31) of the shifter 50. Respective multiplexers 98 (e.g., 98A, 98B . . . 98DD) may be controlled by a respective output from logic gates 100 (e.g., OR gates, 100A, 100B . . . 100CC) and by outputs from the logic gates 78 of the shift decoder 80. For example, if the shift value signal (Shift_value<4:0>) selects (e.g., Shift_value<4:0>="00100"=4) a flip-flop 74E corresponding to a fifth output (S4) of the shifter 50 to receive the RCMD_After_DLINE signal, the first output (S1') through the fourth output (S4') of the signal generator 64 outputs in accordance with the corresponding output of the shifter 50 (e.g., S1 . . . S4), whereas all the outputs S5' to S31' output a high level regardless of the corresponding shifter 50 outputs (e.g., S5 to S31).

Figure 5:
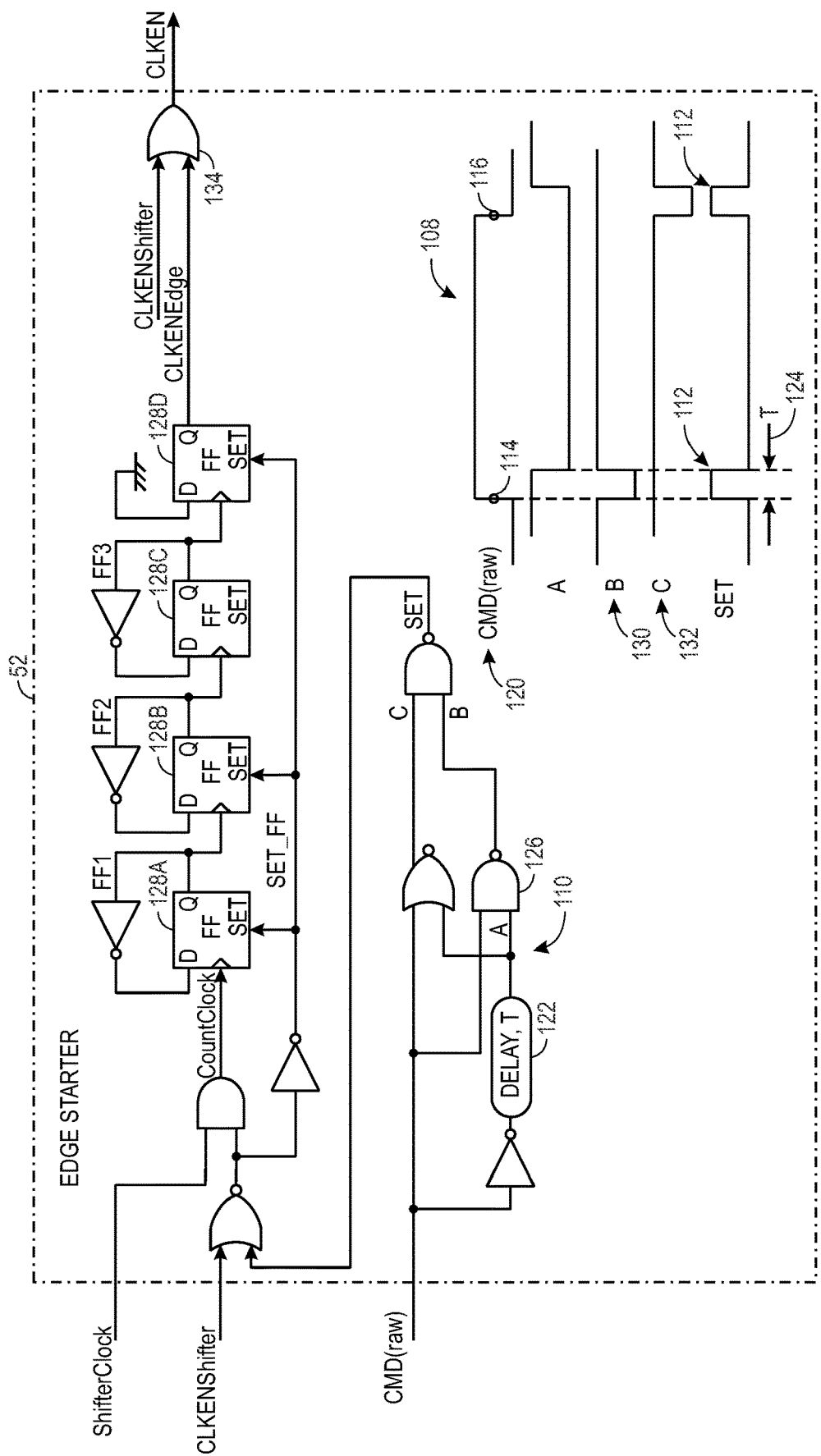
FIG. 5 is a block diagram of an example edge starter of the RQED circuitry of FIG. 2, in accordance with an embodiment of this disclosure.

Referring briefly back to FIG. 2, the read data enable delay (RQED) circuitry 32 includes the edge starter 52 that receives the clock enable shifter signal (CLKENShifter). Referring now to FIG. 5, a block diagram of the edge starter 52 of FIG. 2 is illustrated. As depicted in FIG. 5 and explained with the inset graph 108, the edge starter 52 includes a one-shot pulse generator 110 that generates a one-shot pulse signal (SET) 112 in response to each rising edge 114 and falling edge 116 of a received memory command signals (CMD (raw)) (e.g., represented by signal 120). The duration of the one-shot pulse signal (SET) 112 may be determined based at least in part on delay circuitry 122 (e.g., delay amount=duration 124, t) included before logic gate 126 (e.g., NAND gate). The one-shot pulse generator 110 couples to four flip-flops 128 (e.g., 128A, 128B, 128C, 128D) and provides an enabled one-shot pulse signal (SET) 112 in response to a pulse signal (e.g., signal 130 of inset graph 108) indicating a beginning of the memory command signal (CMD (raw)) (e.g., signal 120) and a pulse signal (e.g., signal 132 of inset graph 108) indicating an end of the memory command signal (CMD (raw)) (e.g., signal 120). By the time of the one-shot pulse signal (SET) enabling, each of the flip-flops 128 are brought into a SET state to provide a high level signal output via an output terminal (Q). The flip-flops 128 may be coupled in such a way as to provide a ripple counter. In this ripple counter, the first flip-flop 128A is clocked by an external clock (e.g., CountClock signal) and subsequent flip-flops 128 (e.g., 128B, 128C, 128D) are clocked by an output from a preceding flip-flop. For example, flip-flop 128B is clocked by the output from flip-flop 128A. It should be understood that in some embodiments other suitable counters and/or counting circuitry may be used with or to replace the ripple counter. The high level output of the flip-flop 128D may change a clock enable edge signal (CLKENEdge) to a high level causing the clock enable signal (CLKEN) to also change to a high level. Since the clock enable signal (CLKEN) changes state in response to an output determination of a logic gate 134 (e.g., OR gate), the clock enable signal (CLKEN) is also changed to a high level in response to a high level of the clock enable shifter signal (CLKENShifter).

Referring briefly back to FIG. 2, in response to the clock enable signal (CLKEN) having a high level, the delay locked loop clock signal (DLLCLK) controls the shifter 50 such that the shifter 50 is clocked by the shifter clock signal (ShifterClock) (e.g., via being inputted to the logic gate 54). Returning to FIG. 5, the shifter clock signal (ShifterClock) is also provided to the flip-flops 128. This may facilitate synchronizing clocking between flip-flops 128 and flip-flops 74 (FIG. 3). The shifter clock signal may be used to suspend providing the clock enable signal (CLKEN). As depicted, when eight pulses of the ShifterClock are provided to the flip-flops 128 (e.g., ripple counter), the clock enable edge signal (CLKENEdge) is changed to a low level by the last flip-flop 128D.

Figure 6:
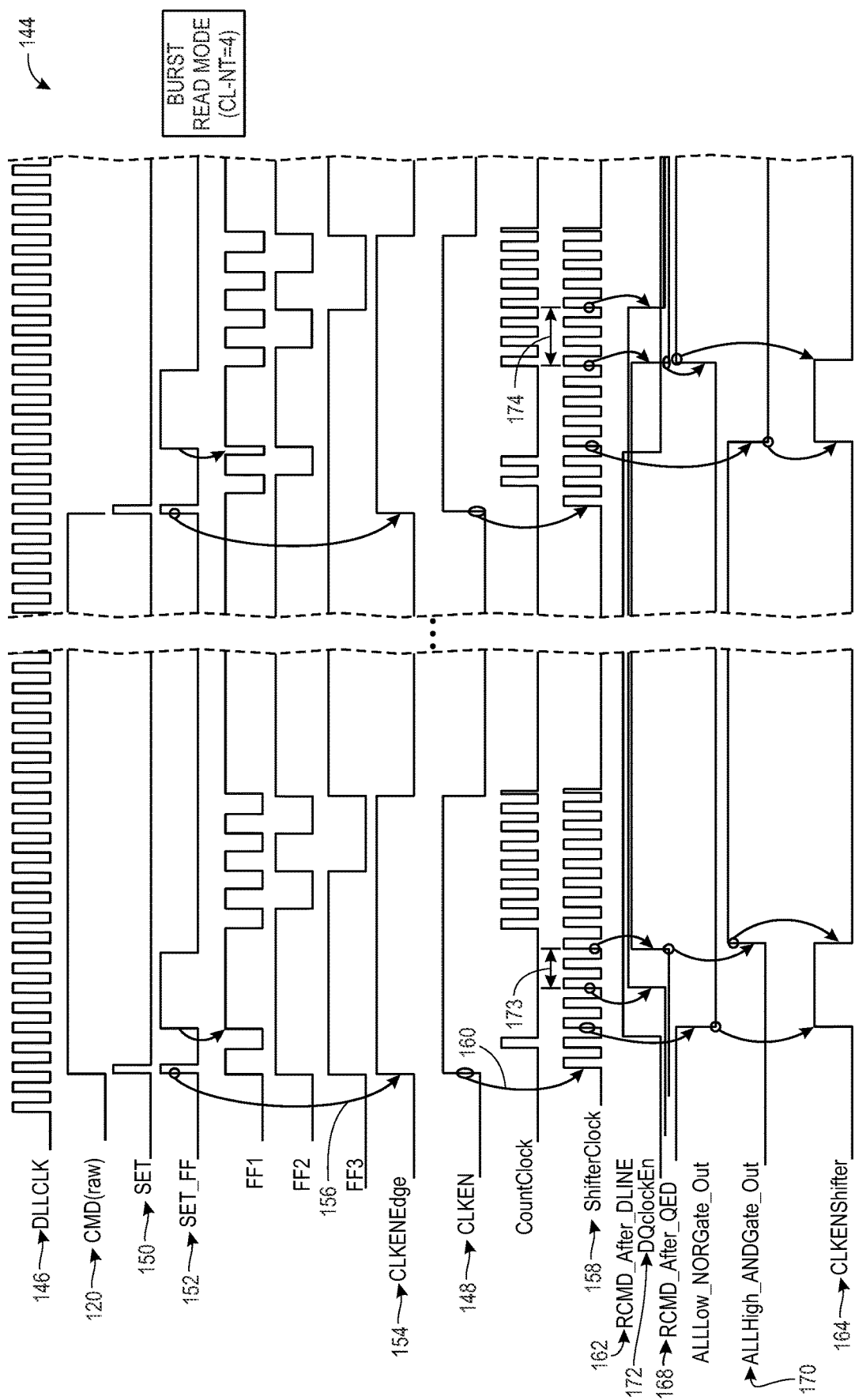
FIG. 6 is a timing diagram of signals associated with operating the RQED circuitry of FIG. 2 in a burst read mode, in accordance with an embodiment of this disclosure.

With the foregoing in mind, FIG. 6 is a timing diagram 144 of respective clock signals and various input/output signals used by the edge starter of FIG. 5 and other components of the read data enable delay (RQED) circuitry 32 of FIG. 2 while operating in a burst read mode (e.g., when CL-NT=4). As a reminder, the burst read mode may refer to a memory access operation responsive to a plurality of read commands being asserted consecutively, where the apparatus 12 accesses and transmits data to/from memory without going through each transmission process sequentially for each memory access (e.g., memory accessing happen generally simultaneously to increase data throughput). It is noted that for the following discussions, circuitry and arrangements depicted in FIG. 1 through FIG. 5 are referenced without explicitly being referred back to FIG. 1 through FIG. 5, for ease of explanation.

As depicted, the delayed lock loop clock signal (DLLCLK) remains as a constantly provided output from the clock delay line 36, represented by DLLCLK signal 146. The memory command signal (CMD (raw)), as represented by CMD (raw) signal 120, may be enabled in response to the command input buffer and decoder circuitry 30 receiving a command (CMD). It should be understood that the received command (CMD) associated with the timing diagram 144 of FIG. 6 corresponds to a read command, thus operations related to a determination of whether the received command (CMD) is a read command are generally not described with respect to the timing diagram 144. It should be also noted that the CMD (raw) signal continues to take a high level in the burst read mode as a plurality of read commands is asserted consecutively.

The CMD (raw) signal 120 is received by the edge starter 52 at a first time. The edge starter 52 may generate a clock enable signal (CLKEN), as represented by CLKEN signal 148, based on generation of SET signal 150 and SET_FF signal 152 which may cause the initialization of the flip-flops 128 of the edge starter 52. The SET_FF signal 152 may cause the rising edge of the clock enable edge signal (CLKENEdge), as represented by CLKENEdge signal 154, (e.g., indicated by arrow 156) which may subsequently cause the rising edge of the CLKEN signal 148.

Enabling of the CLKEN signal 148 may cause the enabling of the shifter clock signal (ShifterClock), as represented by ShifterClock signal 158 (e.g., relationship indicated by arrow 160). After the CLKEN signal 148 is enabled, the logic gate 54 coupled to an output of the edge starter 52 receives the CLKEN signal 148 and causes generation of the ShifterClock signal 158 in accordance with timing of the DLLCLK signal 146. The ShifterClock signal 158 is a clocking signal used to control transmission of the RCMD_After_DLINE signal, represented by RCMD_After_DLINE signal 162, through the flip-flops 74 of FIG. 3.

Based on the shift value signal (Shift_value<4:0>) output from the shift calculator 56, shift decoder 80 circuitry corresponding to a particular output (e.g., respective of the flip-flops 74 and of the multiplexers 82) is selected to receive the RCMD_After_DLINE signal 162. At a similar time, the shift decoder 80 logic gates 78 operate to select a subset of the multiplexers 98 to transmit according to the respectively corresponding outputs from the shifter 50 (e.g., shifter 50 outputs S1 . . . S31 respectively correspond to S1' . . . S31'). These outputs are generated based at least in part on the logical results from each of the logic gates 100. Thus, for the example of shift calculator 56 output CL-NT=4 (e.g., Shift_value<4:0>=4), the shift decoder 80 circuitry selected corresponds to the output S4 and S4', but the signal transmitted from the output S4' is selected based on the signal transmitted from the logic gate 100E and on the logic result transmitted from the logic gate 78D. For example, the signal transmitted from output S3' is high based at least in part on the output from the logic gate 78C (e.g., low level signal) and the logic gate 100D (e.g., high level signal based on the output from logic gate 78D selected by the Shift_value<4:0>="00100" being OR'd with a low level signal from logic gate 100E). In this way, for example, the logic gate 78A through the selected logic gate 78D each output a high signal to respective of the multiplexers 98 (e.g., 98A, 98B, 98C, 98D) to select the outputs from the shifter 50 (e.g., S1, S2, S3, S4) to transmit to the logic gate 94 as outputs from the multiplexers 98 (e.g., S1'=S1, S2'=S2, and so on).

Thus, in response to the shift calculator 56 output (e.g., shift value signal, Shift_value<4:0>), the signal generator 64 may transmit the clock enable shifter signal (CLKENShifter), represented by CLKENShifter signal 164. The RCMD_After_DLINE signal 162 enters the shifter 50 and subsequent transmission between the multiplexers 82 and the flip-flops 74 occurs in accordance with timing from the ShifterClock signal 158. Transmission continues until the entire RCMD_After_DLINE signal 162 is transmitted through the shifter 50. At the first time that a low signal (e.g., signaling an end of the RCMD_After_DLINE signal 162) enters at the shifter 50 at a selected of the multiplexers 82 (e.g., selected by the calculation result and the Shift_value<4:0>), the corresponding output to the signal generator 64 changes, thereby changing an output from the logic gate 94 (e.g., corresponding to ALLHigh_ANDGate_Out signal 170). Furthermore, after the RCMD_After_DLINE signal 162 enters the shifter 50 and at a substantially similar time as the RCMD_After_DLINE signal 162 is output from a third output (S2), the DQ clock enable signal (DQclockEN) is enabled, as represented by a rising edge of DQclockEN signal 172. A number of flip-flops between the third output (S2) and the first output (S0) used to transmit the RCMD_After_QED signal 168 may determine a number of clock cycles or transitions between the rising edge of the DQclockEN signal 172 and the rising edge of the RCMD_After_QED signal 168 (e.g., represented by timing group 173). For example, two outputs and thus two clock cycles are to occur before a high level output at the third output (S2) is able to transmit as a high level output at the first output (S0).

At the end of the RCMD_After_DLINE signal 162 transmitting into the shifter 50, the ALLHigh_ANDGate_Out signal 170 changes state to indicate the end of the RCMD_After_DLINE signal 162. At this time, however, the RCMD_After_DLINE signal 162 may still be transmitting through components of the shifter 50 causing RCMD_After_QED signal 168 to still be depicted as transmitting from the shifter 50. After the end of the transmission of the RCMD_After_QED signal 168, the first output (S0) from the shifter 50 transmits a low level. The first output (S0) low level signal is transmitted to the logic gate 58 causing a low level signal to be transmitted to the flip-flops 62 and logic gate 60. This manifests as the falling edge of the DQclockEN signal 172. The falling edge of the DQclockEN signal 172, occurs a number of clock transitions (e.g., indicated by transition group 174) after the end of the RCMD_After_QED signal 168, where the number of clock transitions corresponds to the number of flip-flops 62. Additional signals depicted on the timing diagram 144 are labeled on FIGS. 1-5 and represent intermediate outputs to facilitate the selective enabling of the DQclockEN signal 172 in response to the RCMD_After_QED signal 168.

Figure 7:
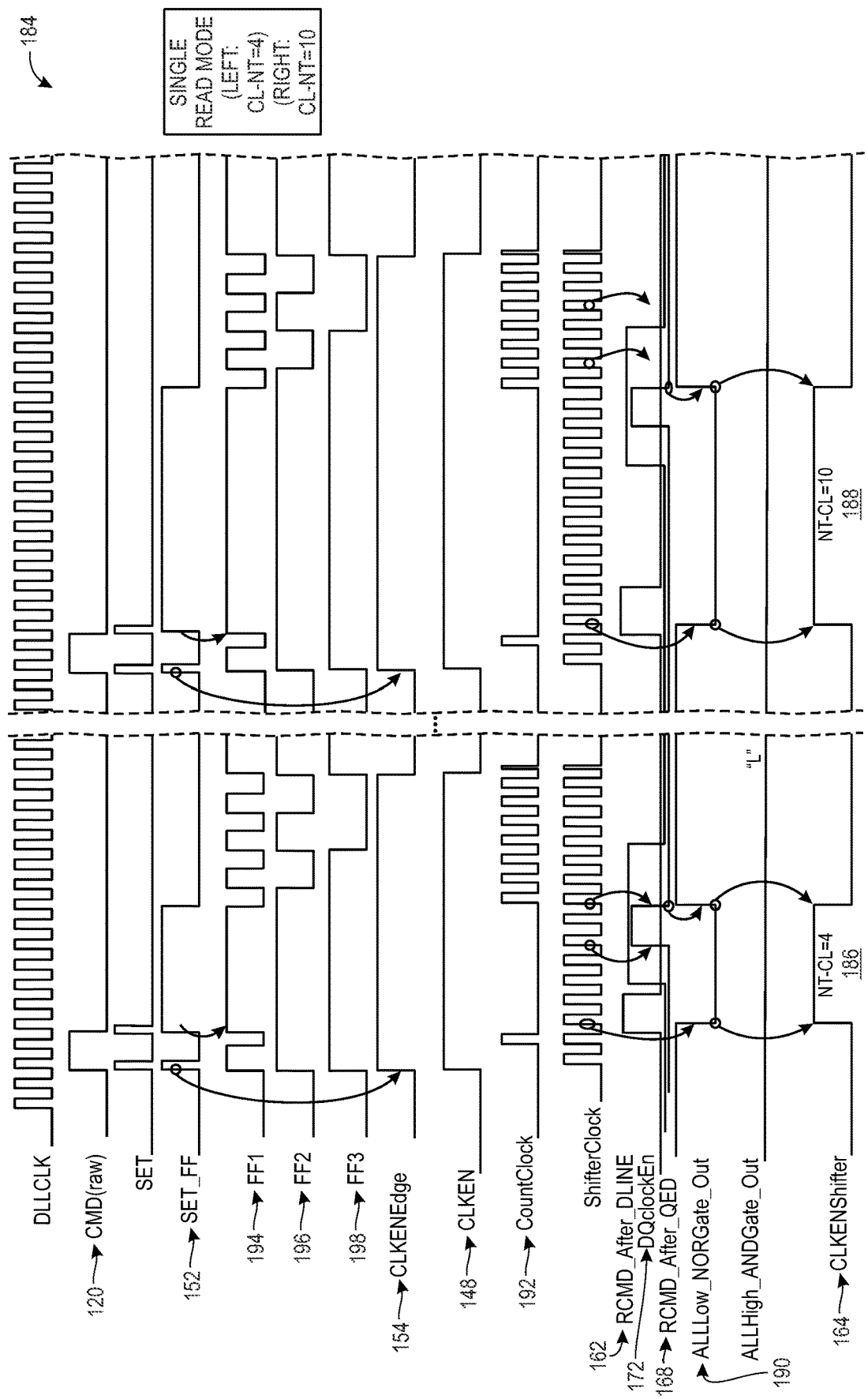
FIG. 7 is a timing diagram of signals associated with operating the RQED circuitry of FIG. 2 in a single read mode, in accordance with an embodiment of this disclosure.

To provide an additional example of read data enable delay (RQED) circuitry 32 operation, FIG. 7 is a timing diagram 184 of respective clock signals and various input/output signals used by the edge starter 52 and other components of the read data enable delay (RQED) circuitry 32 of FIG. 2 while operating in a single read mode where a calculation result is changed between commands (e.g., portion 186 corresponding to: CL-NT=4, portion 188 corresponding to: CL-NT=10). As a reminder, the single read mode may refer to a memory access operation where the apparatus 12 accesses and transmits data to/from memory sequentially for each memory access based on a single read command. It is noted that for the following discussions, circuitry and arrangements depicted in FIG. 2 through FIG. 5 are referenced without explicitly referring to those figures, for ease of explanation. It should be understood that the received command (CMD) associated with the timing diagram 184 of FIG. 7 corresponds to a read command, thus operations related to a determination of whether the received command (CMD) is a read command are generally not described with respect to FIG. 7.

Comparing FIG. 7 to FIG. 6, many of the signals are similar or substantially the same as signals previously described in FIG. 6 with respect to FIG. 1 through FIG. 5, and thus specific description of these signals are not included with FIG. 7. The timing diagram 184 depicts clearing how the change in the calculation result affects the timing of signals generated. For example, the portion 186 (e.g., having the calculation result of 4) shows about 4 clock cycles between the rising edge of the RCMD_After_DLINE signal 162 and the rising edge of the RCMD_After_QED signal 168, while the portion 188 (e.g., having the calculation result of 10) shows the same signals having about 10 clock cycles between the rising edges. This highlights a change the calculation result has on the generated signals. The calculation result may change transmission delays associated with the read command (e.g., CMD (raw) signal 120) being transmitted onto the DQ system 16. For example, a smaller calculation result causes the RCMD_After_QED signal 168 to be transmitted to the DQ system 16 faster than a larger calculation result since the calculation result generally selects the number of flip-flops 74 that the read command is transmitted through before being transmitted to the DQ system 16. This timing difference manifests in portion 188 as a longer duration output from logic gate 92, represented by ALLLow_NORGate_Out signal 190, a longer CLKENShifter signal 164, a longer duration between the falling edge of the RCMD_After_DLINE signal 162 and the rising edge of the DQclockEn signal 172, a longer duration of low level associated with a ripple counter clocking signal represented by CountClock signal 192, and longer signals for the SET_FF signal 152 which effects signal timing for a first flip-flop (FF1) signal 194 associated with an output from flip-flop 128A, a second flip-flop (FF2) signal 196 associated with an output from flip-flop 128B, a third flip-flop (FF3) signal 198 associated with an output from flip-flop 128C, the CLKENEdge signal 154, and the CLKEN signal 148.

Accordingly, the technical effects of the present disclosure include techniques for generating a selective enabling signal to control when a delay locked loop clock signal (DLLCLK) is transmitted to a data (DQ) system for use in memory reading and/or writing operations. The techniques include systems and methods for generating a DQ clock enable signal (DQclockEn) that is inputted into a logical gate (e.g., an AND gate) to control transmission of the logical gate output in accordance with timing transitions of the delay locked loop clock signal (DLLCLK). One or more additional circuits, such as flip-flop circuitry, may control a number of clock transitions between permitting the delay locked loop clock signal (DLLCLK) to transmit to the DQ system and between actually transmitting a read command to the DQ system. By selectively permitting the delay locked loop clock signal (DLLCLK) to transmit to the DQ system, techniques for reducing power consumed by a memory system and/or an apparatus may improve because of a manufacturer having increased control over when a DQ system consumes power associated with the delay locked loop clock signal. Furthermore, power consumed by the DQ system (and therefore the memory system and/or apparatus) is reduced because the delay locked loop clock signal (DLLCLK) is transmitted when a command that references the particular clock signal is transmitted but not when a command is transmitted that does not use the clock.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A device, comprising:
a shifter comprising a plurality of flip-flops, wherein the shifter is configured to:
receive a command signal from a delay line circuit;
generate a delayed command signal at least in part by delaying the command signal by a programmable number of clock cycles; and
output the delayed command signal to a data (DQ) system at a first time, wherein the output of the delayed command signal stops at a second time; and
one or more flip-flops coupled in series and configured to output a clock enable signal to a logic gate for a duration of time, wherein the duration of time corresponds to a length of time between a clock cycle before the first time and a clock cycle after the second time.

2. The device of claim 1, wherein the programmable number of clock cycles is set based at least in part on a calculation result output from a shift calculator.

3. The device of claim 2, wherein the shift calculator generates the calculation result based at least in part on a latency signal and a delay indication signal.

4. The device of claim 1, wherein the command signal comprises a read command.

5. The device of claim 1, wherein the clock cycle after the second time corresponds to a number of clock cycles equal to a number of flip-flops of the one or more flip-flops.

6. The device of claim 1, comprising:
a delay line coupled to the shifter, wherein the delay line is configured to transmit the command signal to the shifter and to transmit the delayed command signal to the DQ system, wherein the command signal is characterized by a delay and an original command signal;

an edge starter configured to provide a clock enable signal at least partly in response to a change in level of the original command signal; and a gate circuit configured to provide a shifter clock signal at least partly in response to the clock enable signal.

7. The device of claim 6, wherein the edge starter is configured to suspend providing the clock enable signal after a plurality of shift clocks has been provided to the shifter as the shifter clock signal.

8. The device of claim 1, wherein the programmable amount of delay is based at least in part on a relative position of a selected flip-flop from the plurality of flip-flops selected to capture the command signal.

9. The device of claim 8, wherein the selected flip-flop is determined based at least in part on an output from a shift calculator generated in response to a delay indication signal (NT) and a latency signal.

10. A method for operating a read data enable delay (RQED) circuit comprising a shifter formed from a first plurality of flip-flops, comprising:

receiving, at the shifter, a plurality of signals that select one of the first plurality of flip-flops;

receiving, at the shifter, a command signal at the selected one of the first plurality of flip-flops;

generating, via the shifter, a delayed command signal at least in part by delaying the command signal by a number of clock cycles programmed based at least in part on a relative position of the selected one of the first plurality of flip-flops; and outputting, via the shifter, the delayed command signal to a data (DQ) system and to a second plurality of flip-flops coupled in series at a first time, wherein the output of the delayed command completes at a second time, wherein the second plurality of flip-flops are configured to output a clock enable signal to a logic gate for a length of time between a clock cycle before the first time and a clock cycle after the second time.

11. The method of claim 10, wherein receiving, at the shifter, the plurality of signals that select one of the first plurality of flip-flops comprises receiving, at the shifter, the plurality of signals from a shift calculator, wherein the shift calculator is configured to generate the plurality of signals based at least in part on a delay indication signal (NT) and a latency signal.

12. The method of claim 10, comprising:

receiving, at the shifter, the command signal at a respective multiplexer of each of the first plurality of flip-flops;

receiving, at the shifter, the plurality of signals at respective logic gates corresponding to each of the first plurality of flip-flops; and delaying, via the shifter, the output of the command signal in response to outputs from the respective logic gates changing an output from a respective multiplexer of the selected one of the first plurality of flip-flops to output the command signal as opposed to a shifter clock signal.

13. The method of claim 10, wherein the second plurality of flip-flops comprises four flip-flops, causing the length of time to equal four clock transitions.

14. The method of claim 10, wherein receiving the command signal comprises receiving, at the shifter, a write command.

15. A read data enable delay (RQED) circuit communicatively coupled between input circuitry and a data (DQ) system, the RQED circuit comprising:

a shifter comprising a first group of flip-flops configured to generated a delayed command at least in part by delaying a command by by a programmable number of clock cycles; and a second group of flip-flops coupled in series, wherein the second group of flip-flops is configured to output a clock enable signal to the DQ system for a duration of time longer than a duration used to transmit the delayed command to the DQ system, wherein the duration of time is defined from a number of flip-flops in the second group of flip-flops.

16. The RQED circuit of claim 15, comprising a shift calculator configured to determine the programmable number of clock cycles based at least in part on a latency signal and a delay indication signal.

17. The RQED circuit of claim 16, wherein the shifter comprises a plurality of shift-stages, and wherein the shifter is configured to:

receive, from the shift calculator, a plurality of signals that select one of the plurality of shift-stages;

receive the command at each of the plurality of shift-stages;

generate the delayed command at least in part by delaying the command by the first duration; and output the delayed command to the DQ system and to the second group of flip-flops coupled in series.

18. The RQED circuit of claim 17, wherein the programmable number of clock cycles is equal to a duration of a number of clock cycles corresponding to a relative position of the selected one of the plurality of shift-stages.

19. The RQED circuit of claim 15, wherein the first group of flip-flops comprises four flip-flops, and wherein the second group of flip-flops comprises four flip-flops.

20. The RQED circuit of claim 15, comprising:

an edge starter configured to provide a clock enable signal; and a gate circuit configured to provide a shifter clock signal responsive to overlapping logical high intervals of the clock enable signal and the delay locked loop clock signal, wherein the shifter is configured to delay the processed command by the first duration at least partially in response to clocking transitions of the shifter clock signal.

* * * * *